(12) United States Patent
Hook et al.

(10) Patent No.: US 9,059,120 B2
(45) Date of Patent: Jun. 16, 2015

(54) IN-SITU RELAXATION FOR IMPROVED CMOS PRODUCT LIFETIME

(71) Applicant: International Business Machines Corporation, Armonk, NY (US)

(72) Inventors: Terence B. Hook, Jericho, VT (US); Melanie J. Sherony, Wappingers Falls, NY (US); Christopher M. Schnabel, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 39 days.

(21) Appl. No.: 14/077,723

(22) Filed: Nov. 12, 2013

(65) Prior Publication Data

US 2015/0132862 A1 May 14, 2015

(51) Int. Cl.
| | |
|---|---|
| H01L 21/00 | (2006.01) |
| H01L 21/326 | (2006.01) |
| H01L 21/8238 | (2006.01) |
| H01L 27/092 | (2006.01) |
| H03K 3/356 | (2006.01) |

(52) U.S. Cl.
CPC .......... *H01L 21/326* (2013.01); *H01L 21/8238* (2013.01); *H01L 27/092* (2013.01); *H03K 3/356104* (2013.01)

(58) Field of Classification Search
None
See application file for complete search history.

(56) References Cited

U.S. PATENT DOCUMENTS

| | | | |
|---|---|---|---|
| 5,978,277 A | 11/1999 | Hsu et al. | |
| 5,982,225 A * | 11/1999 | Forhan et al. | 327/538 |
| 5,999,455 A | 12/1999 | Lin et al. | |
| 6,841,445 B2 | 1/2005 | Cappelletti | |
| 7,002,397 B2 | 2/2006 | Kubo et al. | |
| 8,422,322 B2 | 4/2013 | Hsu et al. | |
| 2011/0001184 A1 | 1/2011 | Andrieu et al. | |
| 2012/0281481 A1 | 11/2012 | Lue et al. | |

* cited by examiner

*Primary Examiner* — David E Graybill
(74) *Attorney, Agent, or Firm* — Wood, Herron & Evans, LLP; Anthony J. Canale

(57) ABSTRACT

Methods and structures for restoring an electrical parameter of a field-effect transistor in an integrated circuit deployed in an end product. A source, a drain, and a gate electrode of a field-effect transistor are coupled with ground. A restoration voltage is applied to a well beneath the field-effect transistor while the source, the drain, and the gate electrode of the field-effect transistor are coupled with ground. The well may be coupled with either a positive supply voltage or ground when a switch is in a first position during normal operation of the integrated circuit and with the restoration voltage when the switch is in a second position during a relaxation operation.

11 Claims, 2 Drawing Sheets

IN-SITU RELAXATION FOR IMPROVED CMOS PRODUCT LIFETIME

BACKGROUND

The invention relates generally to integrated circuits and, in particular, to methods and assemblies for extending the useful lifetime of an integrated circuit.

The operating requirements of an integrated circuit apply stress on the constituent devices, which may reduce performance over time and cause reliability problems. In particular, complementary metal oxide semiconductor (CMOS) field-effect transistors may experience shifts in electrical parameters and adverse changes in performance over their useful lifetime when biased and operated in an end product.

One effect that may reduce the useful lifetime of CMOS field-effect transistors is interface degradation during operation. Interface degradation may originate from an increase in trap density at device interfaces, such as interfaces with the gate dielectric layer, caused by voltage stress over time. Because of the trapping of charge carriers, the switching characteristics of the CMOS field-effect transistor can be changed. Another effect that may reduce the useful lifetime of CMOS field-effect transistors is the presence of mobile carriers in the gate dielectric layer. These mobile carriers trigger numerous physical damage processes that can drastically change the device electrical parameters over prolonged periods of operation. For example, damage accumulation can eventually cause the integrated circuit to fail by causing shifts in the threshold voltages of the CMOS field-effect transistors.

Improved methods and structures are needed to counteract or reverse shifts in electrical parameters and performance degradation experienced by CMOS field-effect transistors over their useful lifetime.

SUMMARY

In an embodiment of the invention, a method is provided for restoring an electrical parameter of a field-effect transistor in an integrated circuit. The method includes coupling a source, a drain, and a gate electrode of the field-effect transistor with ground. The method further includes applying a restoration voltage to a well beneath the field-effect transistor while the source, the drain, and the gate electrode of the field-effect transistor are coupled with ground.

In an embodiment of the invention, a structure includes an integrated circuit with a field-effect transistor and a well beneath the field-effect transistor, a first power supply configured to supply a positive supply voltage and ground to the integrated circuit, and a second power supply configured to supply a restoration voltage to the integrated circuit. The field-effect transistor has a source, a drain, and a gate electrode. The structure further includes a switch having a first position coupling either the positive supply voltage or ground from the first power supply with the well during normal operation of the integrated circuit and a second position coupling the first restoration voltage from the second power supply with the well during a relaxation operation.

BRIEF DESCRIPTION OF THE SEVERAL VIEWS OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
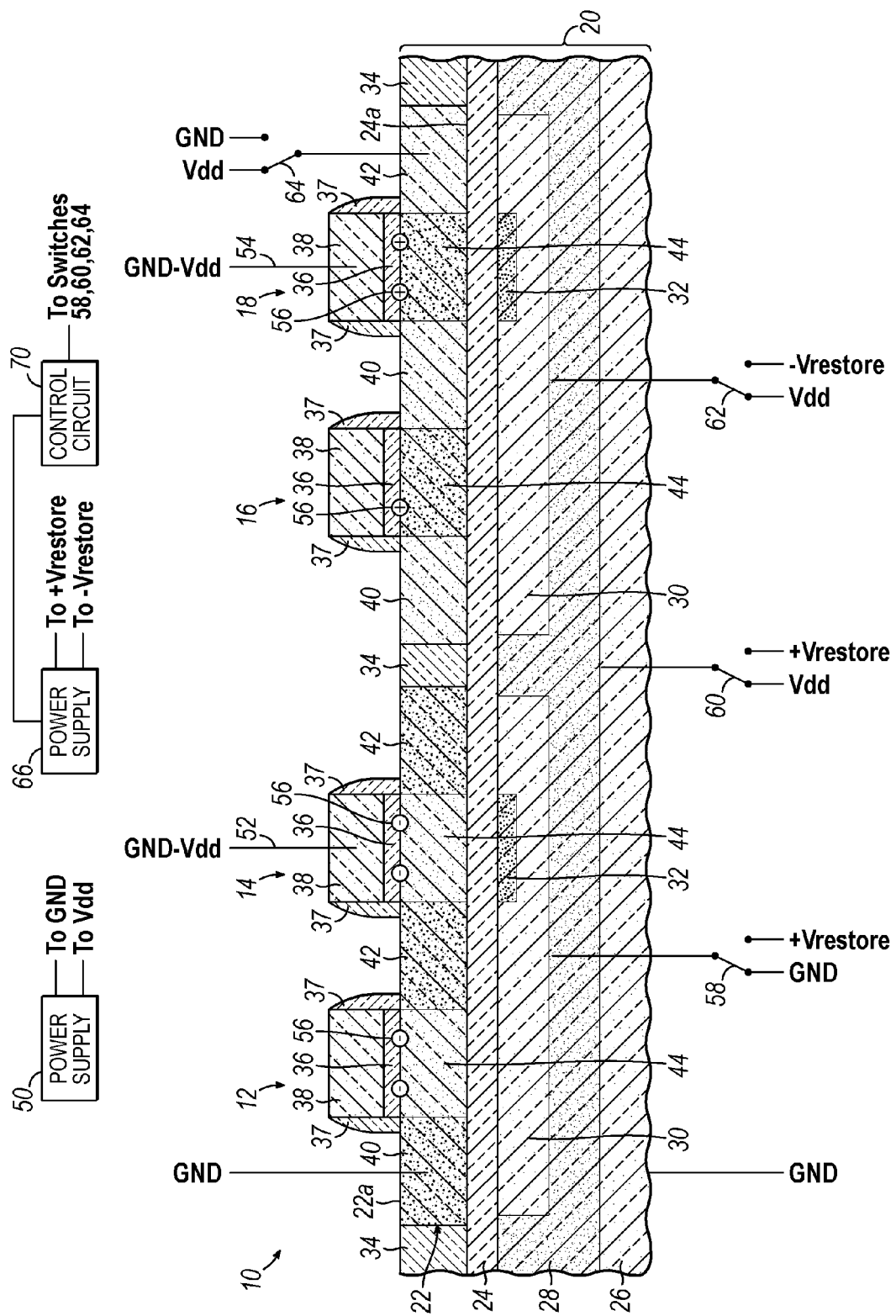
FIG. 1 is a cross-sectional view of field-effect transistors wired with a relaxation circuit in accordance with an embodiment of the invention and biased in normal operation.

With reference to FIG. 1 and in accordance with an embodiment of the invention, an integrated circuit 10 is comprised of a plurality of field-effect transistors 12, 14, 16, 18 that are arranged at the top surface of a semiconductor-on-insulator (SOI) wafer 20. The SOI wafer 20 includes a device layer 22, a buried insulator layer 24, and a substrate 26. The device layer 22 is separated from the substrate 26 by the intervening buried insulator layer 24 to provide electrical isolation and is considerably thinner than the substrate 26. In one embodiment, the thickness of the device layer 22 may range from about 3 nm to about 100 nm. In one embodiment, the device layer 22 may have a thickness in the ultra-thin regime (i.e., 3 nm to 10 nm) suitable to manufacture fully-depleted SOI devices (FDSOI). The device layer 22 is supported on a top surface of the buried insulator layer 24 and is electrically insulated from the substrate 26 by the buried insulator layer 24. The buried insulator layer 24 may be comprised of an electrical insulator and, in particular, may constitute a buried oxide layer that is comprised of silicon dioxide (e.g., $SiO_2$). After front-end-of-line (FEOL) and back-end-of-line (BEOL) processing are completed, the SOI wafer 20 is diced to define a plurality of chips. The integrated circuit 10 is included in one of the chips and the chip is packaged for installation in an electronic end product.

The device layer 22 and the substrate 26 may be comprised of a semiconductor material, such as single crystal silicon or another single crystal semiconductor material that contains primarily silicon. An isolation well 28 is formed in the substrate 26. The semiconductor material comprising the isolation well 28 and the semiconductor material comprising the remainder of the substrate 26 have opposite conductivity types. For example, the isolation well 28 may comprise heavily-doped n-type semiconductor material applied as an in-situ doped epitaxial layer and the remainder of the substrate 26 may comprise lightly-doped p-type semiconductor material.

A well 30 is comprised of sections of heavily-doped semiconductor material positioned within the isolation well 28. The sections of the well 30 are formed by introducing an electrically-active dopant at selected locations in the isolation well 28 to counterdope the semiconductor material of isolation well 28. In one embodiment, the sections of well 30 may be formed in the substrate 26 by implanting ions comprising the dopant and with sufficient kinetic energy to penetrate through the device layer 22 and buried insulator layer 24 in the presence of a patterned sacrificial mask on the device layer 22. The semiconductor material of the well 30 may comprise a p-type dopant selected from Group III of the Periodic Table (e.g., boron (B)) that is effective to impart p-type conductivity. The semiconductor material of the well 30 has an opposite conductivity type from the semiconductor material of the isolation well 28.

A well 32 is comprised of sections of heavily-doped semiconductor material positioned within the isolation well 28. The well 32 is formed by introducing an electrically-active dopant at selected locations within each well 30 to counterdope the semiconductor material of well 30. In one embodiment, the sections of well 32 may be formed in the substrate 26 by implanting ions comprising the dopant and with sufficient kinetic energy to penetrate through the device layer 22 and buried insulator layer 24 in the presence of a patterned sacrificial mask on the device layer 22. The semiconductor material of the well 32 may comprise an n-type dopant from Group V of the Periodic Table (e.g., phosphorus (P) or arsenic (As)) that is effective to impart n-type conductivity. The semiconductor material of well 32 has an opposite conductivity type from the semiconductor material of well 30. The isolation well 28 electrically isolates the wells 30, 32 from the remainder of the substrate 26, and may have the same conductivity type as well 32.

Isolation regions 34 are provided in the device layer 22. The isolation regions 34 may be formed by a shallow trench isolation (STI) technique that relies on lithography and dry etch processes to define trenches that reach in depth to the top surface 24a of the buried insulator layer 24, deposit an electrical insulator to fill the trenches, and planarize the electrical insulator relative to the top surface 22a of the device layer 22 using, for example, chemical mechanical polishing (CMP). The electrical insulator comprising the isolation regions 34 may be an oxide of silicon deposited by chemical vapor deposition (CVD). Alternatively, the isolation regions 34 may be formed by selectively removing the device layer 22 and subsequently allowing the opened spaces to be filled with insulating material after the complete formation of the device and during middle-end-of-line or back-end-of-line processing.

The field-effect transistors 12, 14, 16, 18 may be fabricated by complementary metal oxide semiconductor (CMOS) processes in front end of line (FEOL) processing, and the chip or die including the integrated circuit 10 may be categorized as a CMOS product. Each of the field-effect transistors 12, 14, 16, 18 includes a gate dielectric layer 36 and a gate electrode 38 that are positioned on the top surface 22a of the device layer 22 as a gate structure with the gate dielectric layer 36 positioned between the gate electrode 38 and the device layer 22. The gate electrode 38 may be comprised of a metal, a silicide, polycrystalline silicon (polysilicon), combinations of these materials, or any other appropriate conductor(s) deposited by physical vapor deposition (PVD), CVD, etc. The gate dielectric layer 36 may be comprised of any suitable dielectric or insulating material including, but not limited to, silicon dioxide, silicon oxynitride, a high-k dielectric material such as hafnium oxide or hafnium oxynitride, or layered combinations of these dielectric materials, deposited by CVD, atomic layer deposition (ALD), etc. The gate dielectric layer 36 and gate electrode 38 may be formed from a layer stack of their constituent materials applied on the top surface 22a of the device layer 22, and then patterning using photolithography and etching processes. The etching process, which may be a wet chemical etch or a dry etch, may rely on one or more etch chemistries that remove the constituent materials selective to (i.e., at a higher etch rate than) the material constituting the device layer 22. Non-conductive spacers 37 may be formed on the exterior sidewalls of each gate dielectric layer 36 and gate electrode 38. Alternatively, a gate structure may be formed by depositing a dielectric layer, polishing the dielectric layer to expose the gate electrode 38, removing the gate electrode 38 with a wet chemical etch, and then refilling the vacant space with appropriate metal layers to re-define the gate electrode 38.

Each of the field-effect transistors 12, 14, 16, 18 includes a source 40 and a drain 42 formed in the device layer 22. The source 40 and drain 42 of field-effect transistors 12, 14 may have an opposite conductivity type from the source 40 and drain 42 of field-effect transistors 16, 18. In one embodiment, source 40 and drain 42 of field-effect transistors 12, 14 may comprise semiconductor material of the device layer 22 that is heavily doped by masked ion implantation with an n-type dopant (e.g., phosphorus (P) or arsenic (As)). In one embodiment, source 40 and drain 42 of field-effect transistors 16, 18 may comprise semiconductor material of the device layer 22 that is heavily doped by masked ion implantation with a p-type dopant (e.g., boron (B)). In an alternate embodiment, the source 40 and drain 42 may be formed by epitaxial growth in the presence of the appropriate (n-type or p-type) dopant. The source 40 and drain 42 of the field-effect transistors 12, 14, 16, 18 may be raised but, even if raised, will include a portion that is disposed in the device layer 22. A channel 44 is defined in the device layer 22 between each source-drain pair. The field-effect transistors 12, 14, 16, 18 may include other components such as halo regions, lightly-doped drain (LDD) regions, etc. in the device layer 22.

The regions of well 32 may define backgates for the field-effect transistor 12 and the field-effect transistor 16. These backgates may be biased to either lower or raise the conduction band in the channel 44 of the field-effect transistors 12, 16 relative to its Fermi level and thereby decrease or increase the threshold voltage, $V_T$, of the field-effect transistors 12 and 16. Thus, the threshold voltage of the field-effect transistor 12 and the threshold voltage of the field-effect transistor 16 may each be adjusted independent of its channel doping with the respective backgate. In one embodiment, the field-effect transistors 12, 14 may be of the same type (e.g., NMOS transistors) and characterized by different threshold voltages due to the work function of the backgate, and the field-effect transistors 16, 18 may be of the same type (e.g., PMOS transistors) and characterized by different threshold voltages due to the work function of the backgate.

When deployed in an end use and biased during normal operation, the substrate 26 beneath isolation well 28 and the well 30 may be coupled with the negative supply voltage (Vss) or ground (GND) of a power supply 50. The isolation well 28 and the well 32 may be coupled with the positive supply voltage (Vdd) of the power supply 50. The sources 40 of the field-effect transistors 12, 14, 16, 18 may be coupled with ground (GND) of the power supply 50 and the drains 42 of the field-effect transistors 12, 14, 16, 18 may be coupled with the positive supply voltage (Vdd) of the power supply 50. The gate electrodes 38 of the field-effect transistors 12, 14, 16, 18 are alternatively coupled with one or the other of the positive supply voltage (Vdd) or ground (GND) from inputs 52, 54 coupled with the power supply 50 to provide low-to-high and high-to-low transitions at the gate electrodes 38. The gate-source voltage, drain-source voltage and source-bulk voltage of the field-effect transistors 12, 14 may all be positive during normal operation. The gate-source voltage, drain-source voltage and source-bulk voltage of the field-effect transistors 16, 18 may all be negative during normal operation.

The operating requirements of the integrated circuit 10 apply stress on the field-effect transistors 12, 14, 16, 18. The field-effect transistors 12, 14, 16, 18 may degrade in performance during the device operation and may not retain their original electrical parameters. Degradation mechanisms may include, but are not limited to, charge accumulation in the gate dielectric layer 36 of the field-effect transistors 12, 14, 16, 18 and the generation of traps at the interface between the gate dielectric layer 36 and device layer 22. These defects 56 can be generated by phenomena such as negative-bias temperature instability, hot carrier injection, etc. The defects 56 can increase leakage current through the gate dielectric layer 36, change observable transistor electrical parameters such as the threshold voltage, saturation current, and drain current, or may even result in device failure due to dielectric breakdown. High switching activity or a high frequency of operation for the field-effect transistors 12, 14, 16, 18 may accelerate defect accumulation.

To reverse the effect of the defects 56, a restoration or relaxation operation may be performed. The relaxation operation is configured to extend the useful lifetime of the field-effect transistors 12, 14, 16, 18 and the integrated circuit 10 including the field-effect transistors 12, 14, 16, 18 by alleviating performance and reliability problems potentially arising from the defects 56.

A relaxation circuit comprises switches 58, 60, 62, 64 that are configurable to change the biasing of the isolation well 28, the wells 30, 32, and the drains 42 of the field-effect transistors 16, 18 away from the biasing conditions that exist under normal operation in order to perform a relaxation operation. The switches 58, 60, 62, 64 may comprise field-effect transistors similar to field-effect transistors 12, 14, 16, 18. The switches 58, 60, 62, 64 are used in conjunction with the power supply 50, which is capable of producing the positive supply voltage (Vdd) and supplying ground (GND), and a power supply 66 configured to produce a positive restoration voltage (+Vrestore) and a negative restoration voltage (−Vrestore). The positive restoration voltage (+Vrestore) and negative restoration voltage (−Vrestore) have opposite polarity. The magnitudes of the positive restoration voltage (+Vrestore) and the negative restoration voltage (−Vrestore) may be equal, the absolute value of the positive restoration voltage (+Vrestore) may be greater than the absolute value of the negative restoration voltage (−Vrestore), or the absolute value of the positive restoration voltage (+Vrestore) may be less than the absolute value of the negative restoration voltage (−Vrestore). The voltages are chosen to avoid forward-biasing the junctions of the wells 28, 30, 32, and causing breakdown.

Switch 58 is configured to couple the isolation well 28 with the positive supply voltage (Vdd) during normal operation of the integrated circuit 10 and with the positive restoration voltage (+Vrestore) during the relaxation operation. In particular, switch 58 has a position (FIG. 1) in which the isolation well 28 is coupled with the positive supply voltage (Vdd) and another position (FIG. 2) in which the isolation well 28 is coupled with the positive restoration voltage (+Vrestore).

Switch 60 is configured to couple the well 30 with ground (GND) during normal operation of the integrated circuit 10 and with the positive restoration voltage (+Vrestore) during the relaxation operation. In particular, switch 60 has a position (FIG. 1) in which the well 30 is coupled with ground (GND) and another position (FIG. 2) in which the well 30 is coupled with the positive restoration voltage (+Vrestore).

Switch 62 is configured to couple the well 32 with the positive supply voltage (Vdd) during normal operation of the integrated circuit 10 and with the negative restoration voltage (−Vrestore) during the relaxation operation. In particular, switch 62 has a position (FIG. 1) in which the well 32 is coupled with the positive supply voltage (Vdd) and another position (FIG. 2) in which the well 32 is coupled with the negative restoration voltage (−Vrestore).

Switch 64 is configured to couple the drains 42 of the field-effect transistors 16, 18 with the positive supply voltage (Vdd) during normal operation of the integrated circuit 10 and with ground (GND) during the relaxation operation. In particular, switch 64 has a position (FIG. 1) in which the drains 42 of the field-effect transistors 16, 18 are coupled with the positive supply voltage (Vdd) and another position (FIG. 2) in which the drains 42 of the field-effect transistors 16, 18 are coupled with ground (GND).

Figure 2:
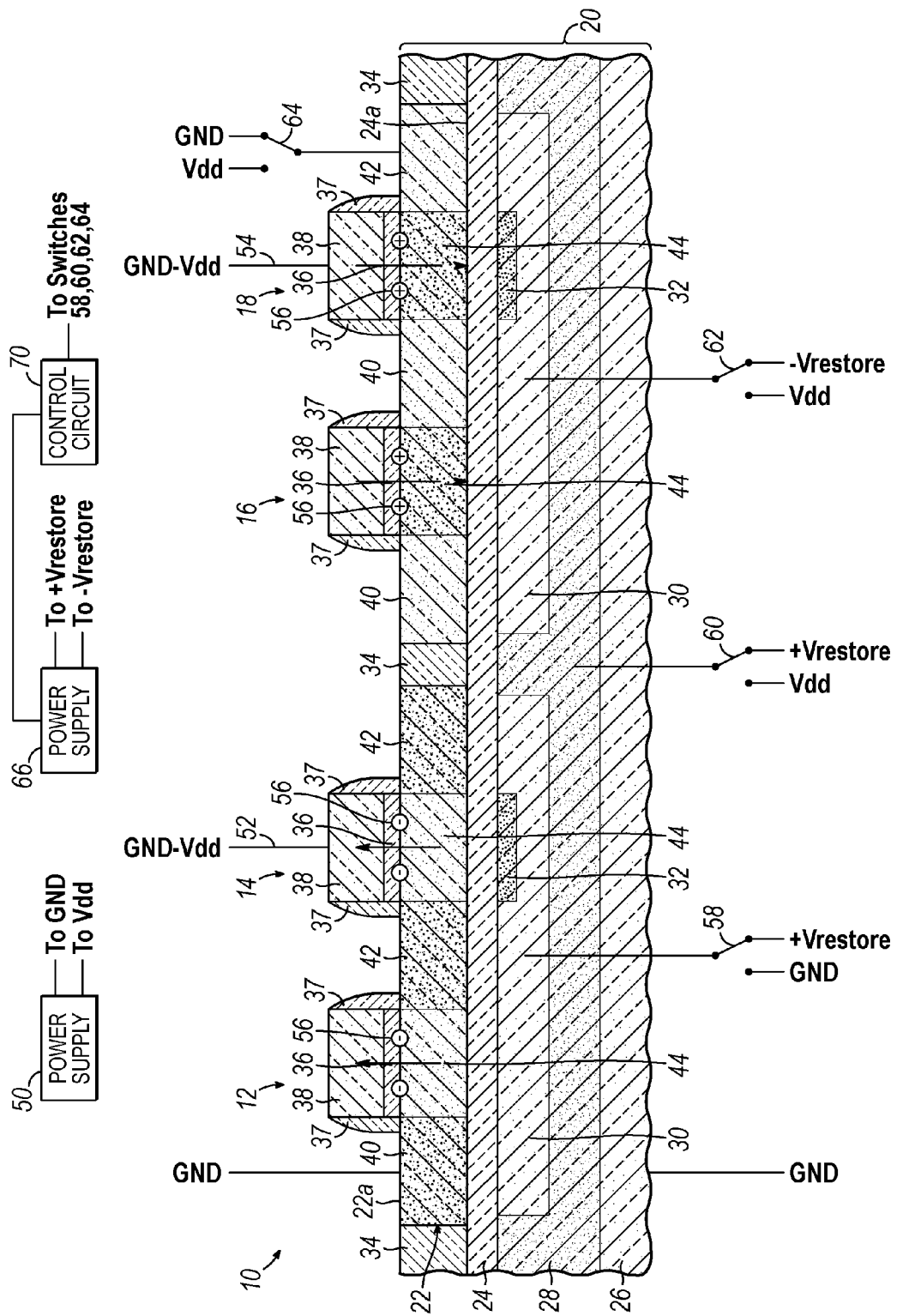
FIG. 2 is a cross-sectional view similar to FIG. 1 in which the relaxation circuit is activated to subject the field-effect transistors to a relaxation operation.

A control circuit 70 is coupled in communication with the switches 58, 60, 62, 64 and is configured to be activated to select switch positions to provide biasing for normal operation for the integrated circuit 10 (FIG. 1) or biasing for a relaxation operation for the integrated circuit 10 (FIG. 2). The control circuit 70 may also be coupled in communication with the power supply 66 and may be configured to cause the power supply 66 to be energized to provide the restoration voltages only when performing the relaxation operation. The control circuit 70 may be comprised of on-chip circuitry located on the chip that includes the integrated circuit 10. Alternatively, the control circuit 70 may be comprised of off-chip circuitry. The control circuit 70 may be configured to monitor the integrated circuit 10 for detecting any deterioration in the electrical parameters characterizing the field-effect transistors 12, 14, 16, 18.

The switches 58, 60, 62, 64 and control circuit 70 may be fabricated using the device layer 22 of the SOI wafer 20 during FEOL processing. The chip may also comprise an interconnect structure that is configured to communicate signals to the field-effect transistors 12, 14, 16, 18 of the integrated circuit 10 and to provide the power and ground connections of the integrated circuit 10 with the power supplies 50, 66. The interconnect structure, which may be fabricated during BEOL processing by, for example, damascene processes, includes wiring layers comprised of metal features embedded in a dielectric layer. The metallization levels of the interconnect structure may be formed by lithography and etching techniques characteristic of damascene processes associated with BEOL processing. The switches 58, 60, 62, 64 and field-effect transistors 12, 14, 16, 18 may be coupled by wiring of the interconnect structure with the power supplies 50, 66.

With reference to FIG. 2 in which like reference numerals refer to like features, the integrated circuit 10 is depicted with a biasing scheme for performing a relaxation operation to extend the useful lifetime of the integrated circuit 10. After the end product is placed into use and biased over a time period, a decision may be made to perform the relaxation procedure to recover the initial electrical parameters of the field-effect transistors 12, 14, 16, 18 of the integrated circuit 10. To perform a relaxation operation, the control circuit 70 actuates the switches 58, 60, 62, 64 to direct power from the power supply 66 as needed for the relaxation operation. The relaxation operation can be either manually triggered or automatically triggered. In one embodiment, the triggering decision may be based upon observations, such as sensing or detecting degradation of the electrical parameters of the field-effect transistors 12, 14, 16, 18 of the integrated circuit 10. In another embodiment, the relaxation operation may be automatically scheduled to occur at intervals, such as periodic intervals.

Parameters for the operation of the power supply 66 that may be selected with instructions or programmed settings include, but are not limited to, duration and frequency for the relaxation operation. The power supply 66 may bias the field-effect transistors 12, 14, 16, 18 of the integrated circuit 10 with restoration voltages that are predicted, calculated, or empirically determined to alleviate at least a significant fraction, if not substantially all, of the defects 56 and restore the initial electrical parameters. The biases are supplied over a time duration adequate to impart a desired relaxation effect to the field-effect transistors 12, 14, 16, 18. The time duration of a relaxation operation may be fixed in length (e.g., restoration voltages applied for a given time in response to a command to execute a relaxation operation), controlled by explicit start-anneal and stop-anneal commands, or programmed into a control register within the control circuit 70.

Normal circuit operation may be disabled by grounding the supply potential, i.e., disabling the positive supply voltage (Vdd) at the power supply 50. Under the control of the control circuit 70, the isolation well 28 and the well 30 are coupled by the actuation of switches 58, 60 with a positive restoration voltage (+Vrestore) and the well 32 is coupled by the actuation of switch 62 with a negative restoration voltage (−Vrestore). The magnitude of the restoration voltages is limited only by the breakdown and leakage of the wells 30, 32, and the switches 58, 60, 62, 64 to switch between operating mode and relaxation mode.

The gate electrodes 38 of the field-effect transistors 12, 14, 16, 18 are coupled by the inputs 52, 54 with ground (GND) and the drains 42 of the field-effect transistors 16, 18 are coupled with ground (GND). The coupling of the sources 40 of the field-effect transistors 12, 14 with ground (GND) is unchanged. As a result, the voltages at the gate electrode 38, the source 40, and the drain 42 of each of the field-effect transistors 12, 14, 16, 18 are set to a zero potential reference, the well 30 beneath the field-effect transistors 12, 14 is positively biased relative to the zero potential reference at their gate electrode 38, the source 40, and the drain 42, and the well 32 beneath the field-effect transistors 16, 18 is negatively biased relative to the zero potential reference at their gate electrode 38, the source 40, and the drain 42. The gate-source voltage, drain-source voltage and source-bulk voltage of the field-effect transistors 12, 14, 16, 18 are null (i.e., neither negative nor positive) during the relaxation operation.

The biasing of the relaxation operation creates an electric field at field-effect transistors 12, 14 that is directed from the channel 44 and well 30 toward the gate electrode 38. The biasing of the relaxation operation creates an electric field at field-effect transistors 16, 18 that is directed from the gate electrode 38 toward the channel 44 and well 32. The junctions of the field-effect transistors 12, 14, 16, 18 are not forward biased because the wells 30, 32 are dielectrically isolated from the sources 40 and drains 42 by the buried insulator layer 24 between the wells 30, 32 and the field-effect transistors 12, 14, 16, 18. The biasing applied during the relaxation operation to the wells 30, 32 beneath the field-effect transistors 12, 14, 16, 18 biases the field-effect transistors 12, 14, 16, 18 into accumulation. The detrapping and neutralization of accumulated charge in the gate dielectric layer 36 and at its interfaces is enhanced by performing the relaxation operation.

A feature may be "connected" or "coupled" to or with another element may be directly connected to or coupled with the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for restoring an electrical parameter of at least one field-effect transistor in an integrated circuit, the method comprising:
   coupling a source, a drain, and a gate electrode of a first field-effect transistor with ground; and
   applying a first restoration voltage to a first well beneath the first field-effect transistor while the source, the drain, and the gate electrode of the first field-effect transistor are coupled with ground.

2. The method of claim 1 wherein coupling the source, the drain, and the gate electrode of the first field-effect transistor with ground comprises:
   disabling normal operation of the integrated circuit by grounding a positive supply voltage.

3. The method of claim 1 wherein the source and the drain of the first field-effect transistor are comprised of semiconductor material with n-type conductivity, and the first restoration voltage produces an electric field directed from the first well toward the gate electrode of the first field-effect transistor.

4. The method of claim 1 wherein the source and the drain of the first field-effect transistor are comprised of semiconductor material with p-type conductivity, and the first restoration voltage produces an electric field directed from the gate electrode of the first field-effect transistor toward the first well.

5. The method of claim 1 further comprising:
   coupling a source, a drain, and a gate electrode of a second field-effect transistor with ground; and
   applying a second restoration voltage to a second well beneath the second field-effect transistor with the source, the drain, and the gate electrode of the second field-effect transistor coupled with ground.

6. The method of claim 5 wherein the second restoration voltage has an opposite polarity from the first restoration voltage.

7. The method of claim 1 wherein the source and the drain of the first field-effect transistor are formed in a device layer of a silicon-on-insulator wafer, and the first well is disposed in a substrate of the silicon-on-insulator wafer separated from the device layer by a buried insulator layer of the silicon-on-insulator wafer.

8. The method of claim 7 wherein the device layer has a thickness between 3 nm and 10 nm, and the first field-effect transistor is a fully-depleted silicon-on-insulator device when the integrated circuit is biased during normal operation.

9. The method of claim 1 wherein the integrated circuit is located on a chip, and further comprising:
   generating the first restoration voltage with a power supply on the chip; and
   directing the first restoration voltage to the first well with a control circuit and a switch on the chip.

10. The method of claim 1 wherein the integrated circuit is located on a chip, and further comprising:
    generating the first restoration voltage with a power supply off the chip; and
    directing the first restoration voltage to the first well with a control circuit and a switch on the chip.

11. The method of claim 1 wherein the integrated circuit is located on a chip, and the electrical parameter is restored while the chip is installed in an end product and after the integrated circuit has been biased in normal operation for a time period in the end product.

* * * * *